(12) United States Patent
Li (10) Patent No.: US 8,193,959 B2
(45) Date of Patent: Jun. 5, 2012

(54) ANALOG TO DIGITAL CONVERTERS

(75) Inventor: Guoxing Li, Sunnyvale, CA (US)

(73) Assignee: O2Micro, Inc., Santa Clara, CA (US)

( * ) Notice: Subject to any disclaimer, the term of this patent is extended or adjusted under 35 U.S.C. 154(b) by 78 days.

(21) Appl. No.: 12/880,939

(22) Filed: Sep. 13, 2010

(65) Prior Publication Data

US 2010/0328122 A1 Dec. 30, 2010
US 2012/0032826 A9 Feb. 9, 2012

Related U.S. Application Data

(63) Continuation-in-part of application No. 12/317,939, filed on Dec. 31, 2008, now Pat. No. 7,796,069.

(60) Provisional application No. 61/063,744, filed on Feb. 6, 2008.

(51) Int. Cl.
*H03M 1/00* (2006.01)
(52) U.S. Cl. .......................... 341/122; 341/155
(58) Field of Classification Search .................. 341/122, 341/155, 143, 172
See application file for complete search history.

(56) References Cited

U.S. PATENT DOCUMENTS

| | | | |
|---|---|---|---|
| 4,968,988 A | 11/1990 | Miki et al. | |
| 5,208,597 A | 5/1993 | Early et al. | |
| 5,248,971 A | 9/1993 | Mandl | |
| 5,351,050 A | 9/1994 | Thompson et al. | |
| 5,712,874 A * | 1/1998 | Okamoto | 375/243 |
| 6,518,903 B1 | 2/2003 | Perraud et al. | |
| 6,765,517 B1 * | 7/2004 | Ali | 341/143 |
| 7,142,606 B2 | 11/2006 | Talwalkar et al. | |
| 7,245,247 B1 * | 7/2007 | May et al. | 341/143 |
| 7,450,046 B2 | 11/2008 | Tada | |
| 7,796,069 B2 | 9/2010 | Li | |

FOREIGN PATENT DOCUMENTS

| | | |
|---|---|---|
| EP | 0551690 A1 | 7/1993 |
| JP | 7249989 A | 9/1995 |
| JP | 2007295197 A | 11/2007 |

OTHER PUBLICATIONS

Extended European Search Report received in European Application No. 09151502.3 dated Jun. 8, 2009.(6 pages).

* cited by examiner

*Primary Examiner* — Brian Young (57) ABSTRACT

In one embodiment, an analog to digital converter (ADC) for converting an analog signal to a digital signal includes an input channel for receiving the analog signal, and includes a first and second sampling-integrating units. The first sampling-integrating unit receives the analog signal, samples the analog signal, integrates a superposition of a first feedback signal and a sampled signal of the analog signal, and generates a first output signal. The second sampling-integrating unit receives the first output signal, samples the first output signal, integrates a superposition of a second feedback signal and a sampled signal of the first output signal, and generates a second output signal. The ADC includes a feedback circuit for generating the digital signal according to the second output signal and for providing the first and second feedback signals indicative of the digital signal to the first and second sampling-integrating units respectively.

8 Claims, 9 Drawing Sheets

ANALOG TO DIGITAL CONVERTERS

RELATED APPLICATION

This application is a continuation-in-part of the U.S. Application, filed on Dec. 31, 2008, titled "Analog to Digital Converters", Ser. No. 12/317,939, now U.S. Pat. No. 7,796,069, which is hereby incorporated by reference in its entirety, and which claims priority to U.S. Provisional Application No. 61/063,744, filed on Feb. 6, 2008.

BACKGROUND

In data acquisition application fields, sometimes multiple analog signals are captured and converted to digital signals over a given time frame simultaneously or parallelly.

In one of the conventional architectures, a sample/hold block is employed for each input channel. All analog signals from the input channels are sampled simultaneously and then enter hold states. During the hold time period, an analog to digital converter (ADC) can be used to convert the sampled analog values to digital signals sequentially until the sampled signals from all the input channels are converted to digital signals. Some drawbacks exist in this architecture. For instance, multiple sample/hold blocks may be required for multiple channels and the sample/hold blocks can be sensitive to high frequency noises without low-pass filtering capabilities.

In another conventional architecture, each input channel employs an individual ADC. Therefore, multiple ADCs are required in a data acquisition system with multiple input channels. Averaging-type ADCs can be used in this architecture to implement synchronization among multiple input channels. However, power consumption, die area and cost of the data acquisition system can be increased if multiple ADCs are employed. In addition, different ADCs may cause mismatch among multiple input channels.

SUMMARY

In one embodiment, an analog to digital converter (ADC) for converting an analog signal to a digital signal includes an input channel for receiving the analog signal, and further includes a first and second sampling-integrating units coupled in series for processing the received analog signal. The first sampling-integrating unit receives the analog signal from the input channel, samples the analog signal, integrates a superposition of a first feedback signal and a sampled signal of the analog signal, and generates a first output signal. The second sampling-integrating unit receives the first output signal, samples the first output signal, integrates a superposition of a second feedback signal and a sampled signal of the first output signal, and generates a second output signal. Each of the first and second sampling-integrating units comprises an energy storage unit and a switch array coupled to the energy storage unit for controlling the energy storage unit. Furthermore, the ADC includes a feedback circuit coupled to the first and second sampling-integrating units and for generating the digital signal according to the second output signal and for providing the first and second feedback signals indicative of the digital signal to the first and second sampling-integrating units respectively.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to the embodiments of the present invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

A multi-channel analog to digital converter (ADC) can convert multiple analog signals from multiple input channels to multiple digital output signals, e.g., multiple analog input voltages to multiple digital output voltages, in an interleaved mode. The multi-channel ADC can be used in various data processing applications, such as video systems, audio systems, signal sensors, etc., which involves analog to digital conversions.

Figure 1:
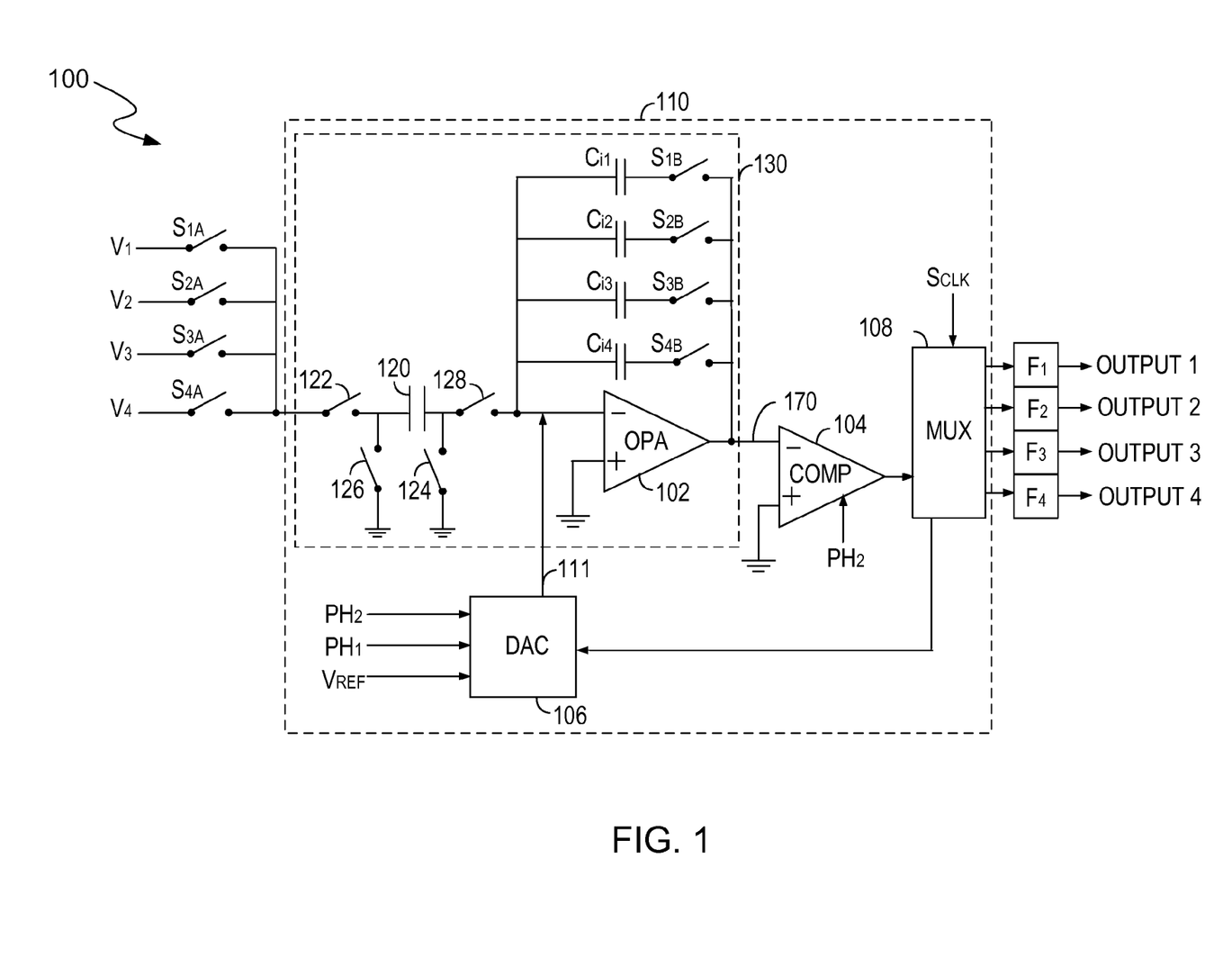
FIG. 1 illustrates a block diagram of a multi-channel analog to digital converter (ADC), in accordance with one embodiment of the present invention.

FIG. 1 illustrates a block diagram of a multi-channel ADC 100, in accordance with one embodiment of the present invention. The multi-channel ADC 100 can be a first-order delta-sigma ADC, in one embodiment.

The multi-channel ADC 100 can have multiple input channels, e.g., four input channels including channel 1, channel 2, channel 3 and channel 4 for converting analog signals, e.g., analog voltage signals $V_1$, $V_2$, $V_3$ and $V_4$, respectively to digital signals in an interleaved mode, in one embodiment.

Each input channel is coupled to an associated switch, e.g., $S_{1A}$ associated with channel 1, $S_{2A}$ associated with channel 2, $S_{3A}$ associated with channel 3, and $S_{4A}$ associated with channel 4. The switches $S_{1A}$, $S_{2A}$, $S_{3A}$ and $S_{4A}$ can be controlled by a system clock signal $S_{CLK}$, in one embodiment. In one embodiment, one input channel is selected during a clock cycle according to the system clock signal $S_{CLK}$. The switch associated with the selected input channel is turned on and other switches are turned off in one clock cycle, in one embodiment.

The multi-channel ADC 100 includes a modulator 110 for converting analog signals, e.g., the analog voltage signals $V_1$, $V_2$, $V_3$ or $V_4$, to digital signals. The modulator 110 can receive an analog signal from a selected input channel and provide a corresponding digital signal to a filter, e.g., a digital filter $F_1$, $F_2$, $F_3$, or $F_4$, associated with the input channel. The analog signal can be various types of signals, e.g., current or voltage signals.

In the modulator 110, the analog signal is input into a sampling-integrating unit 130. In the sampling-integrating unit 130, a sampling circuit can sample the received analog signal at a predetermined sampling frequency, e.g., a frequency equal to Fs*OSR, where Fs is a Nyquist frequency and OSR is an over sampling ratio to the Nyquist frequency. For example, the sampling frequency is 65536 Hz when Fs is 16 Hz and OSR is 4096. The analog signal can be translated to a digital signal at the sampling frequency by the modulator 110. In one embodiment, the digital signal can be a continuous 1-bit data stream including logic 1 and logic 0 at a rate determined by the sampling frequency, e.g., Fs*OSR.

In one embodiment, the sampling circuit includes an energy storage unit, e.g., sampling capacitor 120, coupled to the selected input channel for storing charges from the selected input channel, and further includes a switch array including switches 122, 124, 126 and 128 for controlling the energy storage unit 120. The switches 122 and 124 are controlled by a signal $PH_2$, and the switches 126 and 128 are controlled by a signal $PH_1$. The signals $PH_1$ and $PH_2$ are non-overlapping clock signals, in one embodiment. For example, when the signal $PH_2$ is at a high level and the signal $PH_1$ is at a low level, the switches 122 and 124 can be turned on and the switches 126 and 128 can be turned off. When the signal $PH_1$ is at a high level and the signal $PH_2$ is at a low level, the switches 122 and 124 can be turned off and the switches 126 and 128 can be turned on.

The sampling-integrating unit 130 further includes an integrating circuit coupled to the sampling circuit for receiving the sampled signal of the input analog signal and a feedback signal 111 and for integrating a superposition of the feedback signal 111 and the sampled signal of the input analog signal. The integrating circuit can generate an output signal 170 according to an integration result of the superposition. In the example of FIG. 1, the integrating circuit includes a group of integrating capacitors, e.g., integrating capacitors $C_{i1}$, $C_{i2}$, $C_{i3}$ and $C_{i4}$, and an error amplifier 102.

The integrating capacitors $C_{i1}$, $C_{i2}$, $C_{i3}$ and $C_{i4}$ are coupled in parallel. The integrating capacitors $C_{i1}$, $C_{i2}$, $C_{i3}$ and $C_{i4}$ can accumulate charges from the input channels respectively. Each integrating capacitor $C_{i1}$, $C_{i2}$, $C_{i3}$ or $C_{i4}$ can be coupled to a switch in series, e.g., the integrating capacitor $C_{i1}$ is coupled to a switch $S_{1B}$, the integrating capacitor $C_{i2}$ is coupled to a switch $S_{2B}$, the integrating capacitor $C_{i3}$ is coupled to a switch $S_{3B}$, and the integrating capacitor $C_{i4}$ is coupled to a switch $S_{4B}$.

In one embodiment, the modulator 110 can complete an analog to digital conversion for each input channel sequentially during a conversion cycle. In one embodiment, the integrating capacitors can be randomly allocated to the input channels at the beginning of a conversion cycle. For example, the integrating capacitor $C_{i1}$ can store charges from channel 2, the integrating capacitor $C_{i2}$ can store charges from channel 3, the integrating capacitor $C_{i3}$ can store charges from channel 4, and the integrating capacitor $C_{41}$ can store charges from channel 1, etc. The flexible configuration of the input channels and the integrating capacitors can reduce mismatch between different channels caused by mismatch of the integrating capacitors. In one embodiment, the output signal 170 of the sampling-integrating unit 130 indicates the charges stored in a corresponding integrating capacitor during a previous conversion cycle and an integration result of the superposition of the feedback signal 111 and the sampled signal of the input analog signal.

The error amplifier 102 can receive an input signal, e.g., a superposition of the sampled signal of the input analog signal and the feedback signal 111, through the inverting input terminal and a first reference signal through the non-inverting input terminal, and generate an error signal. In one embodiment, the non-inverting input terminal is connected to ground such that a voltage level of the first reference signal is substantially equal to zero.

The modulator 110 further includes a feedback circuit for generating a digital signal according to the output signal 170 of the sampling-integrating unit 130 and for generating the feedback signal 111 indicative of the digital signal to the integrating circuit. In the example of FIG. 1, the feedback circuit can include a comparator 104, a multiplexer 108, and a digital to analog converter (DAC) 106. In other words, the integrating circuit, the comparator 104, the multiplexer 108, and the DAC 106 together form a feedback loop. The feedback loop includes a feed forward path including the integrating circuit, the comparator 104 and the multiplexer 108, and a feed backward path including the DAC 106.

The comparator 104 coupled to the sampling-integrating unit 130 can compare the output signal 170 of the sampling-integrating unit 130 with a second reference signal and generate a comparator output signal according to the comparison result. The comparator 104 can be controlled by the signal $PH_2$ and can operate when the signal $PH_2$ is at a high level. In one embodiment, a non-inverting terminal of the comparator 104 is connected to ground. Thus, a voltage level of the second reference signal is substantially zero. The comparator 104 can generate a 1-bit digital signal, e.g., logic 1 or logic 0, according to the comparison result. The comparator output signal, e.g., a 1-bit digital signal, is further sent to the multiplexer 108.

In one embodiment, the multiplexer 108 can be a barrel shift register controlled by a system clock signal $S_{CLK}$. The multiplexer 108 can pass the digital signal from the comparator 104, e.g., a 1-bit digital signal, to a corresponding output channel, e.g., a digital filter associated with the selected input channel according to the system clock signal $S_{CLK}$. The output channels can include digital filters $F_1$, $F_2$, $F_3$ and $F_4$, such as decimation filters to decimate the digital signals, e.g., the 1-bit digital signals from the comparator 104, to multi-bit digital output signals. Therefore, multiple digital output signals associated with the multiple input channels can be obtained from the digital filters, e.g., $F_1$, $F_2$, $F_3$ and $F_4$, respectively.

Additionally, the multiplexer 108 can latch the 1-bit digital signal from the comparator 104 associated with each input channel. Consequently, during a current conversion cycle, the 1-bit digital signal of each input channel generated in a previous conversion cycle is latched in the multiplexer 108 until a new 1-bit digital signal is generated. When one input channel is selected according to the system clock signal SILK in the current conversion cycle, the multiplexer 108 can transfer the 1-bit digital signal of the selected input channel which is generated in a previous conversion cycle to the DAC 106. During the first conversion cycle, the multiplexer 108 can transfer a 1-bit digital, e.g., logic 0 to the DAC 106, in one embodiment.

The DAC 106 can be a 1-bit digital to analog converter, in one embodiment. The DAC 106 can receive the 1-bit digital signal from the multiplexer 108 and convert the 1-bit digital signal to an analog signal, e.g., a voltage signal, according to a reference voltage $V_{REF}$. The analog signal generated by the DAC 106 can be used as the feedback signal 111 sent to the integrator 150. The DAC 106 can set the feedback signal 111 equal to $-V_{REF}$ when the 1-bit digital signal is logic 1 and equal to $V_{REF}$ when the 1-bit digital signal is logic 0, in one embodiment. The DAC 106 can be controlled by signals $PH_1$ and $PH_2$. Thus, the value of the feedback signal 111 can be set according to the 1-bit digital signal from the multiplexer 108.

More specifically, when channel 1 is selected according to the system clock signal $S_{CLK}$ in a clock cycle during a current conversion cycle, the modulator 110 can receive the analog signal from channel 1, e.g., the analog voltage signal $V_1$, and a feedback signal 111 from the DAC 106, and generate a 1-bit digital signal. In one embodiment, the feedback signal 111 from the DAC 106 is generated according to a 1-bit digital signal of channel 1 generated in a previous conversion cycle and according to a reference voltage $V_{REF}$. The comparator 104 can generate a 1-bit digital signal to the multiplexer 108. As such, the previous 1-bit digital signal in the multiplexer 108 associated with channel 1 can be replaced by the new 1-bit digital signal generated in the current conversion cycle. The multiplexer 108 can output the 1-bit digital signal generated in the current conversion cycle to the corresponding digital filter $F_1$. A next input channel, e.g., channel 2, can be selected during a next clock cycle of the system clock signal $S_{CLK}$ and a corresponding 1-bit digital signal can be received by an associated filter. For example, channel 1, channel 2, channel 3 and channel 4 are selected sequentially and 1-bit digital signals corresponding to channel 1, channel 2, channel 3 and channel 4 can be received by the digital filter $F_1$, the digital filter $F_2$, the digital filter $F_3$, and the digital filter $F_4$ sequentially. The digital filters, e.g., $F_1$, $F_2$, $F_3$ and $F_4$, can accumulate the 1-bit digital signals for several conversion cycles for corresponding input channels and then generate multi-bit digital output signals.

Although FIG. 1 shows a multi-channel analog to digital converter 100, the invention is not so limited. For example, the modulator 110 can also be used in a single channel analog to digital converter.

Figure 2A:
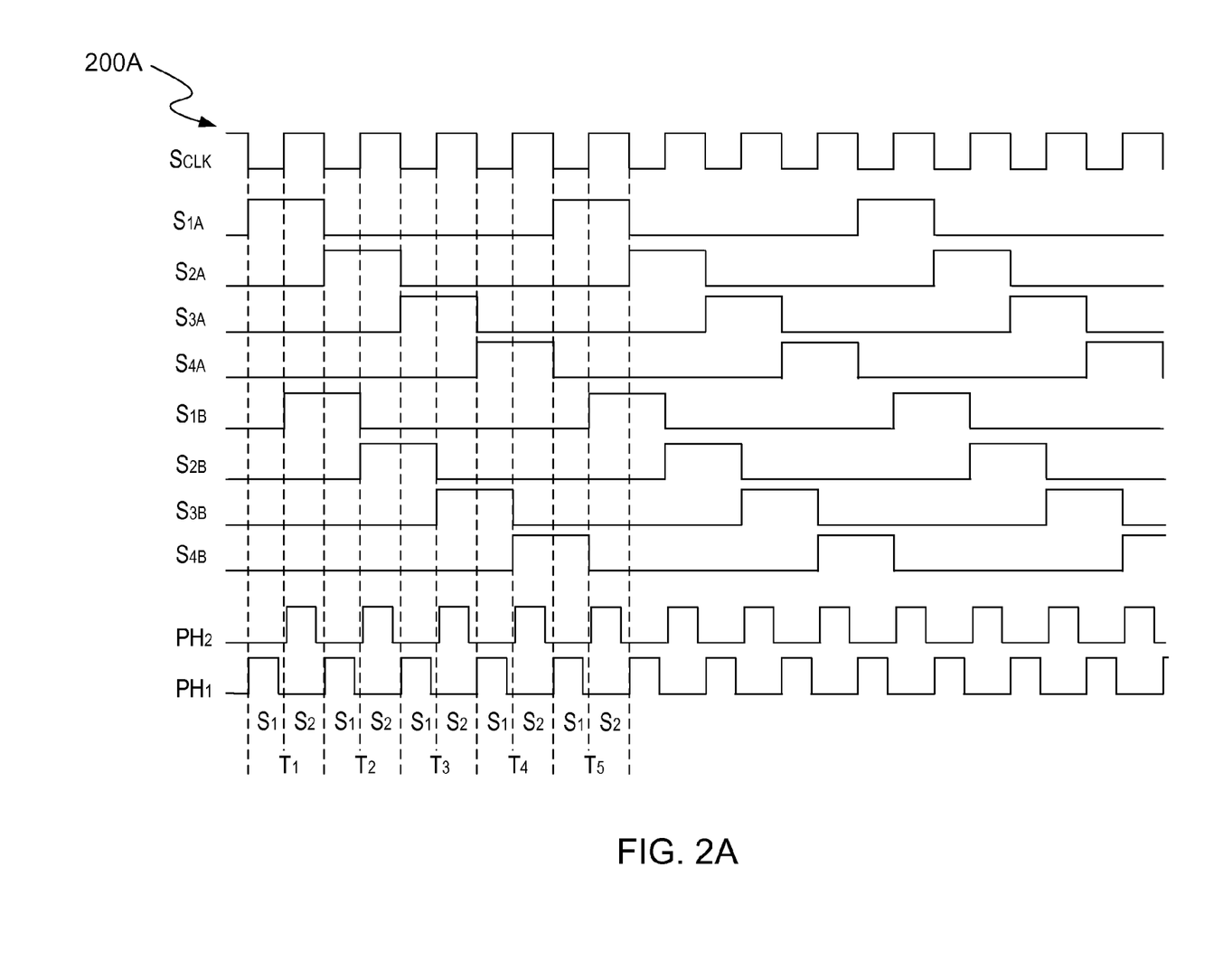
FIG. 2A illustrates a timing diagram of signals associated with a multi-channel ADC, in accordance with one embodiment of the invention.

Operations of the multi-channel ADC 100 are described herein with reference to a timing diagram in FIG. 2A as an example. FIG. 2A illustrates waveforms of the system clock signal $S_{CLK}$, states of the switches $S_{1A}$, $S_{2A}$, $S_{3A}$, $S_{4A}$, $S_{1B}$, $S_{2B}$, $S_{3B}$ and $S_{4B}$, and the signal $PH_2$ and the signal $PH_1$ during operations of the multi-channel ADC 100, in one embodiment. FIG. 2A is only for illustrative purposes, and the present invention is not limited to the operation shown in FIG. 2A. In the example of FIG. 2A, a switch is turned on when a corresponding state waveform is at a high level and the switch is turned off when the corresponding state waveform is at a low level.

In the example of FIG. 2A, a clock cycle of the system clock signal $S_{CLK}$ is divided into two phases including phase $S_1$ when the system clock signal $S_{CLK}$ is at a low level and phase $S_2$ when the system clock signal $S_{CLK}$ is at a high level. For instance, each clock cycle, e.g., $T_1$, $T_2$, $T_3$, $T_4$, $T_5$, etc., includes phase $S_1$ and phase $S_2$. The signal $PH_1$ is set to a high level and the signal $PH_2$ is set to a low level during phase $S_1$ of each clock cycle. Similarly, the signal $PH_1$ is set to a low level and the signal $PH_2$ is set to a high level during phase $S_2$ of each clock cycle. Because the signal $PH_1$ and the signal $PH_2$ are non-overlapping clock signals, the pulse widths of the signal $PH_1$ and the signal $PH_2$ can be smaller than the pulse width of the system clock signal $S_{LCK}$ to avoid overlapping, in one embodiment.

In one embodiment, channel 1 is first selected after the multi-channel ADC 100 is powered on during the clock cycle $T_1$. The switches $S_{1A}$ and $S_{1B}$ associated with channel 1 are turned on and switches associated with other input channels, e.g., channel 2, channel 3 and channel 4, are turned off. In one embodiment, the switch $S_{1B}$ is turned on after a delay of half of a clock cycle, e.g., the switch $S_{1A}$ is turned on during the clock cycle $T_1$ and the switch $S_{1B}$ is turned on during phase $S_2$ of the clock cycle $T_1$ and phase $S_1$ of the clock cycle $T_2$. The switches 122 and 124 are turned on during phase $S_2$ of the clock cycle $T_1$ according to a high level of the signal $PH_2$. Simultaneously, the switches 126 and 128 are turned off according to a low level of the signal $PH_1$ during phase $S_2$ of the clock cycle $T_1$. Therefore, the analog signal from channel 1, e.g., the analog voltage signal $V_1$, can be transferred to the sampling capacitor 120 via the closed switches $S_{1A}$, 124 and 122, and can be sampled. Charges from channel 1 corresponding to the analog voltage signal $V_1$ can be stored in the sampling capacitor 120.

During phase $S_1$ of the clock cycle $T_2$, the switches 122 and 124 are turned off according to a low level of the signal $PH_2$, and the switches 126 and 128 are turned on according to a high level of the signal $PH_1$. Consequently, the charges stored in the sampling capacitor 120 can be transferred to the integrating capacitor $C_{i1}$ via the closed switches 126, 128 and $S_{1B}$.

Additionally, the DAC 106 generates a feedback signal 111 to the integrating circuit according to a 1-bit digital signal of channel 1 in a previous conversion cycle. The output signal 170 of the sampling-integrating unit 130 can be compared with the second reference signal by the comparator 104 when the signal $PH_2$ is at a high level during phase $S_2$ of the clock cycle $T_2$. A 1-bit digital signal of channel 1 can be generated by the comparator 104 and be latched in the multiplexer 108. The digital filter $F_1$ can receive the 1-bit digital signal.

Channel 2 is selected during the clock cycle $T_2$. The operating sequence associated with channel 2 is similar to the operating sequence associated with channel 1. Switches $S_{2A}$, 122 and 124 are turned on and the switches 126 and 128 are turned off according to a high level of the signal $PH_2$ during phase $S_2$ of the clock cycle $T_2$. An input analog signal of channel 2, e.g., an analog voltage signal $V_2$, can be transferred to the sampling capacitor 120 and be sampled. During phase $S_1$ of the clock cycle $T_3$, the switches 122 and 124 are turned off and the switches 126 and 128 are turned on according to a high level of the signal $PH_1$. Because the switch $S_{1B}$ is turned off after phase $S_1$ of the clock cycle $T_2$ and the switch $S_{2B}$ is turned on during phase $S_2$ of the clock cycle $T_2$ and phase $S_1$ of the clock cycle $T_3$, charges stored in the sampling capacitor 120 can be transferred to the integrating capacitor $C_{i2}$ during phase $S_1$ of the clock cycle $T_3$. Then, the comparator 104 can operate during phase $S_2$ of the clock cycle $T_3$ and generate a 1-bit digital signal of channel 2 to the multiplexer 108. The digital filter $F_2$ can receive the 1-bit digital signal.

Similarly, channel 3 can be selected during the clock cycle $T_3$ and can generate a 1-bit digital signal during phase $S_2$ of the clock cycle $T_4$. Channel 4 can be selected during the clock cycle $T_4$ and can generate a 1-bit digital signal during phase $S_2$ of the clock cycle $T_5$. If more input channels are available, the input channels can be selected sequentially during sequential clock cycles. Thus, the analog signals from the input channels can be converted to digital signals sequentially and circularly. For example, if four input channels exist, at least four clock cycles, e.g., $T_1$, $T_2$, $T_3$ and $T_4$, can be used to accomplish one conversion cycle for all the input channels. The digital filters, e.g., $F_1$, $F_2$, $F_3$, or $F_4$, can receive the 1-bit digital signals for the associated input channels, e.g., channel 1, channel 2, channel 3, or channel 4, during each conversion cycle. Then a next conversion cycle starts from the clock cycle $T_5$. Similarly, each input channel is selected sequentially and each analog signal is sampled sequentially. Consequently, each digital filter can accumulate the 1-bit digital signals of the associated input channel during multiple conversion cycles and decimate the 1-bit digital signals to generate a multi-bit digital output signal at a predetermined rate, e.g., Fs.

Assume that the over sampling ratio is OSR, then the time required for a conversion cycle is N*OSR clocks, where N represents the total number of channels, in one embodiment. Advantageously, in one conversion cycle, the analog signals from the input channels can be sampled and converted to 1-bit digital signals respectively and sequentially, in one embodiment. Thus, multi-bit digital output signals of the multiple input channels can be obtained during multiple conversion cycles in a synchronized way. As a result, the multi-channel ADC 100 has an improved efficiency and reduced power consumption, in one embodiment.

Figure 2B:
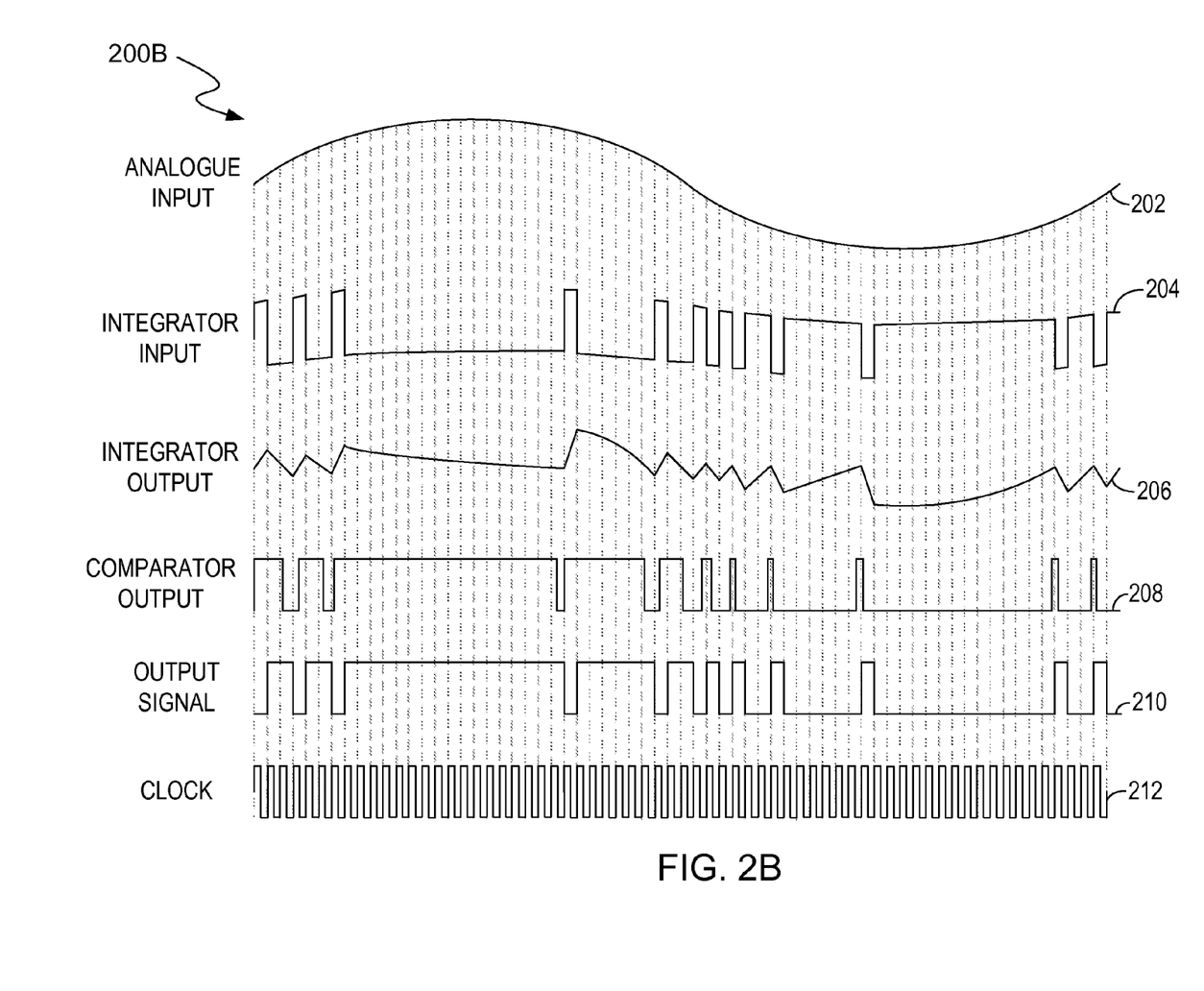
FIG. 2B illustrates a timing diagram of signals associated with a multi-channel ADC, in accordance with one embodiment of the invention.

FIG. 2B shows a timing diagram of signals associated with the multi-channel ADC 100, in accordance with one embodiment of the invention. For example, waveform 202 represents an input analog signal from a corresponding input channel. Waveform 204 represents a superposition of the feedback signal 111 output from the DAC 106 and the sampled signal of the input analog signal obtained from the sampling capacitor 120. Waveform 206 represents the output signal 170 of the integrating circuit. Waveform 208 represents an output signal from the comparator 104. Waveform 210 represents an output signal, e.g., a multi-bit digital signal, obtained from a corresponding digital filter, which indicates the input analog signal. Waveform 212 indicates a sample rate of the input analog signal.

Additionally, in order to speed up the conversions, double sampling technique can be used by adding another switch array, e.g., similar to the switches 122, 124, 126 and 128, and a sampling capacitor, e.g., similar to the sampling capacitor 120, with complementary control clock signals, e.g., $PH_1$ and $PH_2$. In this topology, the speed of the ADC conversion can be doubled without increasing static power consumption. Other sampling techniques, e.g., triple sampling technique can also be used to further speed up the conversions of the ADC 100.

Figure 3:
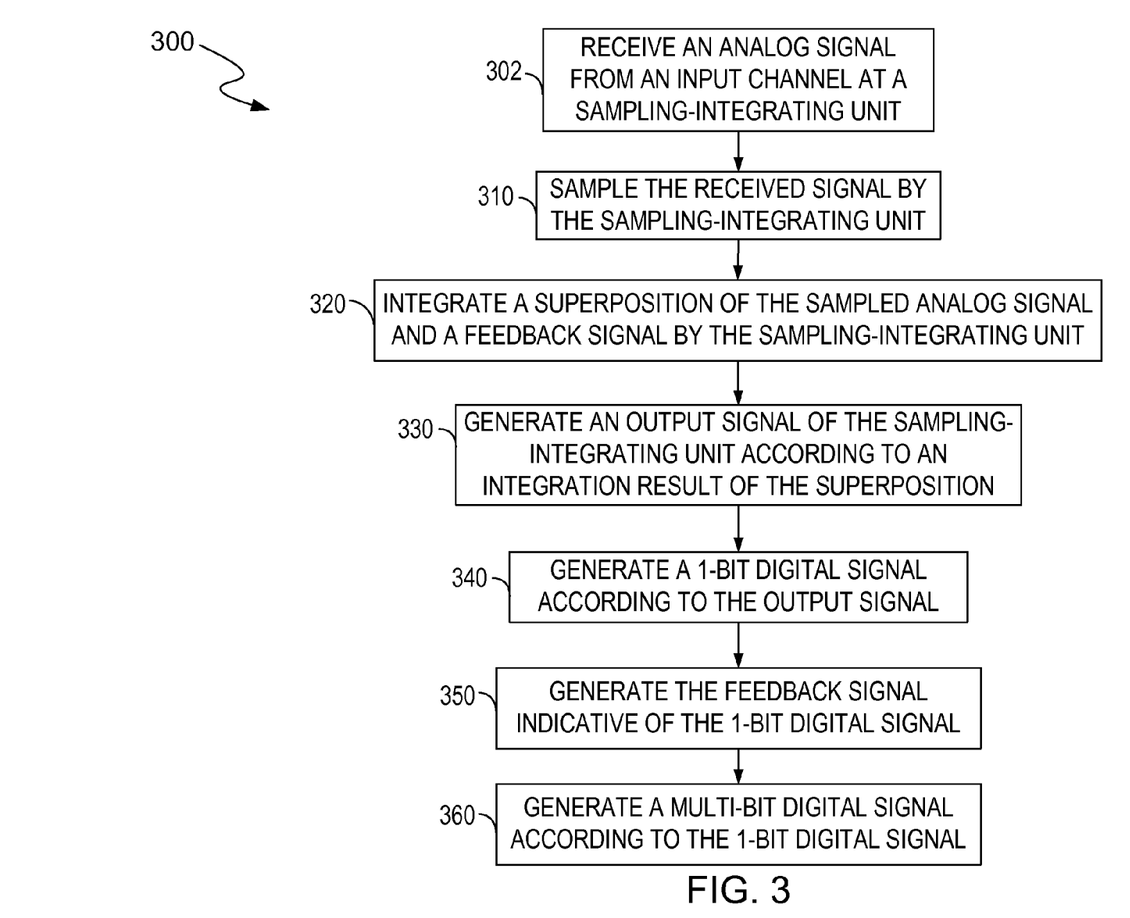
FIG. 3 illustrates a flowchart of operations performed by a multi-channel ADC, in accordance with one embodiment of the present invention.

FIG. 3 illustrates a flowchart 300 of operations performed by an ADC, e.g., the multi-channel ADC 100, in accordance with one embodiment of the present invention. FIG. 3 is described in combination with FIG. 1. One input channel, e.g., channel 1, channel 2, channel 3, or channel 4, is selected to receive an analog signal by the multi-channel ADC 100 during a clock cycle of the system clock signal $S_{CLK}$. In block 302, the analog signal is received by the sampling-integrating unit 130. In block 310, the analog signal is sampled by a sampling circuit in the sampling-integrating unit 130 during the same clock cycle under the control of a switch array. In block 320, a sampled signal of the input analog signal can be transferred to one of the integrating capacitors, e.g., $C_{i1}$, $C_{i2}$, $C_{i3}$ or $C_{i4}$, under the control of an associate switch, e.g., $S_{1B}$, $S_{2B}$, $S_{3B}$, or $S_{4B}$. The integrating circuit in the sampling-integrating unit 130 can integrate a superposition of the sampled signal of the input analog signal and the feedback signal 111. The integrating capacitors can be randomly allocated to the input channels respectively at the beginning of a conversion cycle. In block 330, the integrating circuit generates an output signal 170 according to an integration result of the superposition.

In block 340, a comparator, e.g., the comparator 104, can generate a 1-bit digital signal according to the output signal 170. More specifically, the comparator 104 can compare the output signal 170 with a reference signal to generate the 1-bit digital signal, and can send the 1-bit digital signal to a multiplexer, e.g., the multiplexer 108. In block 350, the multiplexer 108 can output the 1-bit digital signal to the DAC 106 and a corresponding digital filter, e.g., $F_1$, $F_2$, $F_3$, or $F_4$. The feedback signal 111 indicating the 1-bit digital signal is also generated. In block 360, the corresponding digital filter can generate a multi-bit digital output signal according to the 1-bit digital signal. More specifically, the corresponding digital filter can accumulate the 1-bit digital signals for several conversion cycles for a corresponding input channel and then can generate the multi-bit digital output signal.

Figure 4:
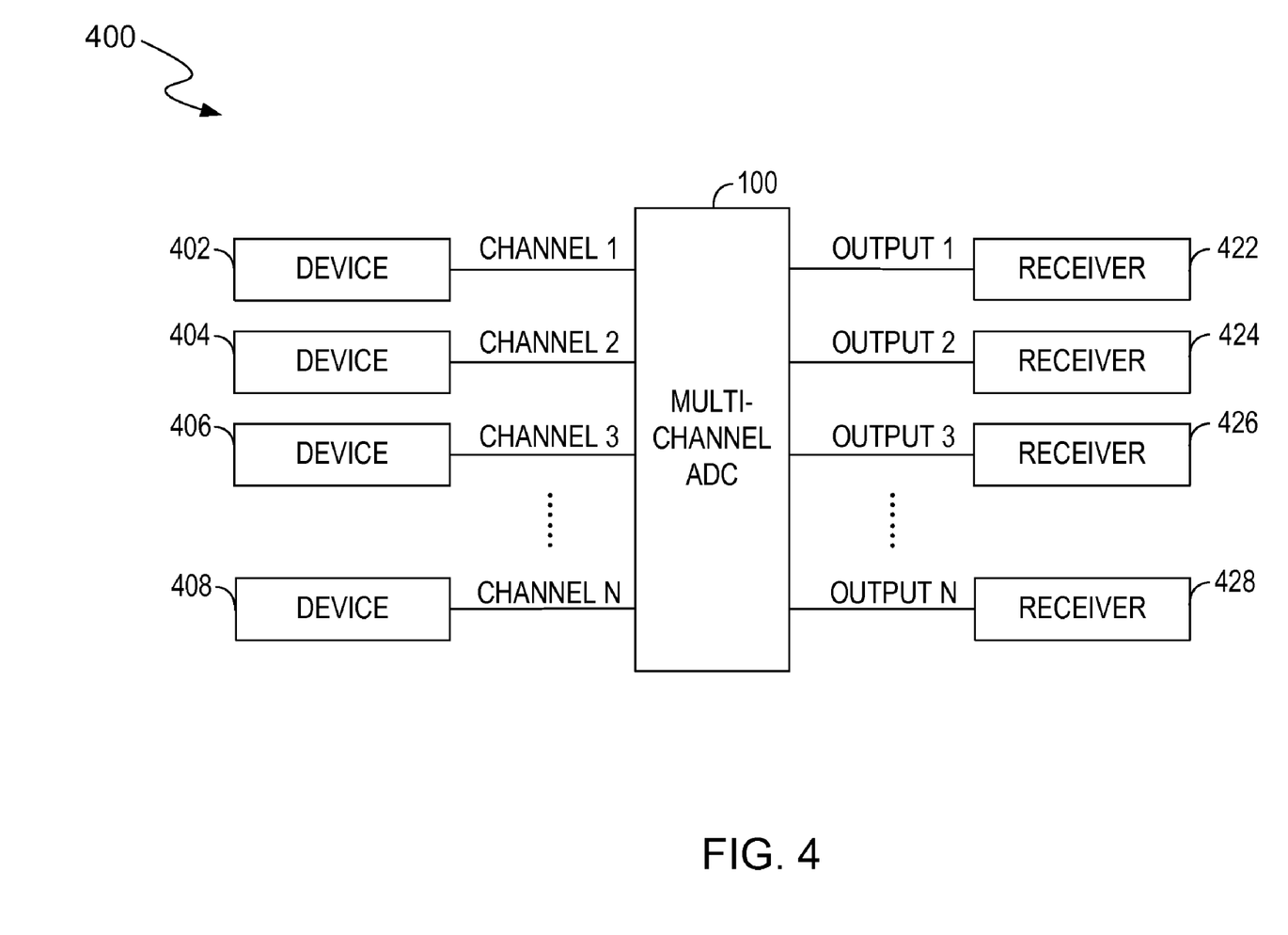
FIG. 4 illustrates a block diagram of an electronic system, in accordance with one embodiment of the present invention.

FIG. 4 illustrates a block diagram of an electronic system 400, in accordance with one embodiment of the present invention. The electronic system 400 employs the multi-channel ADC 100 disclosed hereinabove, in one embodiment. The multi-channel ADC 100 has multiple input channels, e.g., channel 1, channel 2, channel 3, . . . , channel N, for receiving analog signals from multiple devices, e.g., devices 402, 404, 406, . . . , 408, and for converting the analog signals to digital output signals, e.g., output 1, output 2, output 3, . . . , output N, respectively. The digital output signals can be received by various receivers, e.g., receivers 422, 424, 426, . . . , 428. The multiple devices, e.g., the devices 402, 404, 406, . . . , 408, can be various types of devices which generate analog signals. The receivers, e.g., the receivers 422, 424, 426, . . . , 428, can be various types of devices which receive digital signals. For example, the multi-channel ADC 100 can be used for converting analog voltage monitoring signals indicating battery/cell voltages to digital signals. A battery management system can receive the digital signals and control the battery.

Accordingly, an ADC, e.g., the multi-channel ADC, 100 for converting an analog signal to a digital signal includes multiple input channels, e.g., channel 1, channel 2, channel 3, channel 4, etc., a sampling-integrating unit 130, and a feedback circuit coupled to the sampling-integrating unit 130, in one embodiment. One of the multiple input channels is selected to receive an analog signal when the associated switch is turned on. The sampling-integrating unit 130 includes a sampling circuit for sampling the analog signal from the selected input channel. The sampling circuit includes an energy storage unit 120 for storing charges from the selected input channel and includes a switch array for controlling the energy storage unit 120. The sampling-integrating unit 130 further includes an integrating circuit coupled to the sampling circuit for receiving the sampled signal of the input analog signal and a feedback signal 111 from the feedback circuit and for integrating a superposition of the sampled signal of the input analog signal and the feedback signal. The integrating circuit includes multiple capacitors, e.g., integrating capacitors, coupled in parallel and an error amplifier 102. The integrating capacitors are coupled to multiple switches respectively. One of the integrating capacitors can store charges from the energy storage unit 120 when the associate switch is turned on.

The feedback circuit includes a comparator 104 coupled to the integrating circuit of the sampling-integrating unit 130, a multiplexer 108 coupled to the comparator 104, and a DAC 106 coupled between the multiplexer 108 and the sampling-integrating unit 130. The comparator 104 can compare an output signal 170 of the sampling-integrating unit 130 with a reference signal and generate a comparator output signal according to the comparison result. The multiplexer 108 can provide the digital signal according to the comparator output signal. The DAC 106 can generate the feedback signal 111 according to the digital signal. The multi-channel ADC 110 can further include output channels to provide multi-bit digital output signals.

Advantageously, the multi-channel ADC 100 can perform analog to digital conversions for the multiple input channels in an interleaved mode. Multiple sample/hold blocks or multiple ADCs are not required for converting analog signals from multiple input channels, in one embodiment. Hence, the cost of the circuitry can be reduced and the efficiency of the circuitry can be improved. Additionally, the mismatch between multiple ADCs can be reduced or avoided.

Figure 5:
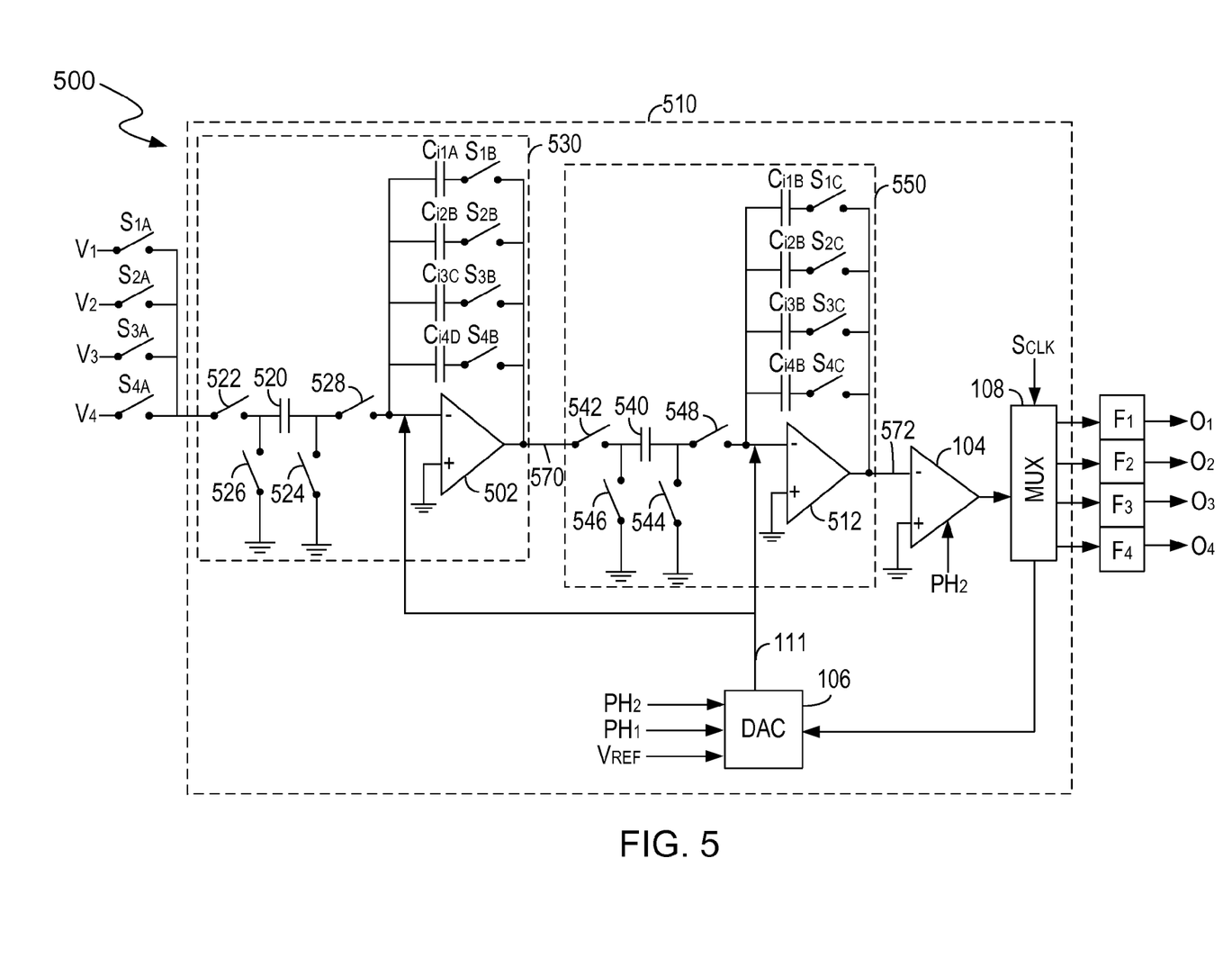
FIG. 5 illustrates a block diagram of a multi-channel ADC, in accordance with another embodiment of the present invention.

FIG. 5 illustrates a block diagram of a multi-channel ADC 500, in accordance with one embodiment of the present invention. The multi-channel ADC 500 can be a multi-order delta-sigma ADC, e.g., a second-order delta-sigma ADC. Elements that are labeled the same as in FIG. 1 have similar functions. FIG. 5 is described in combination with FIG. 1.

As shown in FIG. 5, a modulator 510 converts analog signals, e.g., the analog voltage signals $V_1$, $V_2$, $V_3$ or $V_4$, received from corresponding input channels, e.g., four input channels including channel 1, channel 2, channel 3 and channel 4, to corresponding digital signals. The modulator 510 can be a multi-order delta-sigma modulator, e.g., a second-order delta-sigma modulator. The modulator 510 includes multiple sampling-integrating units coupled in series, e.g., sampling-integrating units 530 and 550 coupled in series. The sampling-integrating units 530 and 550 function similarly to the sampling-integrating unit 130 in FIG. 1. The sampling-integrating unit 530 receives an analog signal via a selected input channel, e.g., the channel 1, and the associated switch, e.g., the switch $S_{1A}$. In the sampling-integrating unit 530, a first sampling circuit can sample the received analog signal at a predetermined sampling frequency. In one embodiment, the first sampling circuit includes an energy storage unit, e.g., sampling capacitor 520, for storing charges from the selected input channel, and further includes a switch array including switches 522, 524, 526 and 528 for controlling the energy storage unit 520. Similarly, the switches 522 and 524 are controlled by a signal $PH_2$, and the switches 526 and 528 are controlled by a signal $PH_1$. The signals $PH_1$ and $PH_2$ are non-overlapping clock signals, in one embodiment.

The sampling-integrating unit 530 further includes a first integrating circuit coupled to the first sampling circuit for receiving the sampled signal of the input analog signal and receiving a feedback signal 111. The first integrating circuit integrates a superposition of the sampled signal of the input analog signal and the feedback signal 111, and generates an output signal 570 according to an integration result of the superposition. The first integrating circuit includes a group of integrating capacitors, e.g., integrating capacitors $C_{i1A}$, $C_{i2A}$, $C_{i3A}$ and $C_{i4A}$, and an error amplifier 502.

The integrating capacitors $C_{i1A}$, $C_{i2A}$, $C_{i3A}$ and $C_{i4A}$ are coupled in parallel. The integrating capacitors $C_{i1A}$, $C_{i2A}$, $C_{i3A}$ and $C_{i4A}$ can accumulate charges from the input channels respectively. Each integrating capacitor $C_{i1A}$, $C_{i2A}$, $C_{i3A}$ or $C_{i4A}$ can be coupled to a switch in series, e.g., the integrating capacitor $C_{i1A}$ is coupled to a switch $S_{1B}$, the integrating capacitor $C_{i2A}$ is coupled to a switch $S_{2B}$, the integrating capacitor $C_{i3A}$ is coupled to a switch $S_{3B}$, and the integrating capacitor $C_{i4A}$ is coupled to a switch $S_{4B}$.

During a conversion cycle, the integrating capacitors can be randomly allocated to the input channels at the beginning of the conversion cycle. In one embodiment, the output signal 570 of the sampling-integrating unit 530 indicates the charges stored in a corresponding integrating capacitor during a previous conversion cycle and an integration result of the superposition of the sampled signal of the input analog signal and the feedback signal 111.

In one embodiment, the error amplifier 502 can generate an error signal according to a difference between an input signal and a first reference signal received through an inverting input terminal and a non-inverting input terminal respectively. The input signal is the superposition of the sampled signal of the input analog signal and the feedback signal 111. The non-inverting input terminal is connected to ground such that a voltage level of the first reference signal is substantially equal to zero, in one embodiment.

The sampling-integrating unit 550 receives the output signal 570 from the sampling-integrating unit 530. The sampling-integrating unit 550 has a similar structure and function as the sampling-integrating unit 530. As such, the output signal 570 can be sampled at a predetermined sampling frequency by a second sampling circuit in the sampling-integrating unit 550. The second sampling circuit includes an energy storage unit, e.g., sampling capacitor 540, and further includes a switch array including switches 542, 544, 546 and 548 for controlling the energy storage unit 540. In one embodiment, the switches 542 and 544 are controlled by the signal $PH_2$, and the switches 546 and 548 are controlled by the signal $PH_1$. The sampling-integrating unit 530 and the sampling-integrating unit 550 sample the input analog signal and the output signal 570 at the same sampling frequency respectively, in one embodiment.

The sampling-integrating unit 550 further includes a second integrating circuit coupled to the second sampling circuit for receiving the sampled signal of the output signal 570 and receiving a feedback signal, e.g., the feedback signal 111. The second integrating circuit integrates a superposition of the sampled signal of the output signal 570 and the feedback signal 111, and generates an output signal 572 according to an integration result of the superposition.

The second integrating circuit includes a group of integrating capacitors, e.g., integrating capacitors $C_{i1B}$, $C_{i2B}$, $C_{i3B}$ and $C_{i4B}$, and an error amplifier 512. The integrating capacitors $C_{i1B}$, $C_{i2B}$, $C_{i3B}$ and $C_{i4B}$ are coupled in parallel. The integrating capacitors $C_{i1B}$, $C_{i2B}$, $C_{i3B}$ and $C_{i4B}$ can accumulate charges of the output signals 570 associated with channel 1, channel 2, channel 3 and channel 4 respectively. Each integrating capacitor $C_{i1B}$, $C_{i2B}$, $C_{i3B}$ or $C_{i4B}$ can be coupled to a switch in series, e.g., the integrating capacitor $C_{i1B}$ is coupled to a switch $S_{1C}$, the integrating capacitor $C_{i2B}$ is coupled to a switch $S_{2C}$, the integrating capacitor $C_{i3B}$ is coupled to a switch $S_{3C}$, and the integrating capacitor $C_{i4B}$ is coupled to a switch $S_{4C}$.

As described above, the integrating capacitors $C_{i1A}$, $C_{i2A}$, $C_{i3A}$ and $C_{i4A}$ can be randomly allocated to the input channels at the beginning of a conversion cycle. Similarly, the integrating capacitors $C_{i1B}$, $C_{i2B}$, $C_{i3B}$ and $C_{i4B}$ can also be randomly allocated to the input channels at the beginning of the conversion cycle. The integrating capacitors $C_{inA}$ and $C_{ikB}$, e.g., n=1, 2, 3, or 4; k=1, 2, 3, or 4, allocated to a corresponding channel are turned on and off simultaneously, in one embodiment. For example, if $C_{i1A}$ and $C_{i3B}$ are allocated to the channel 1, $C_{i1A}$ and $C_{i3B}$ are both turned on when the channel 1 is selected.

Similarly, the error amplifier 512 can generate an error signal according to a difference between an input signal and a second reference signal received through an inverting input terminal and a non-inverting input terminal respectively. The input signal can be the superposition of the sampled signal of the output signal 570 and the feedback signal 111. The non-inverting input terminal is connected to ground such that a voltage level of the second reference signal is substantially equal to zero, in one embodiment.

Furthermore, the feedback circuit including the comparator 104, the multiplexer 108, and the digital to analog converter (DAC) 106 can generate a digital signal according to the output signal 572 of the sampling-integrating unit 550 and generate the feedback signal 111 indicative of the digital signal to the sampling-integrating units 530 and 550. The comparator 104 coupled to the sampling-integrating unit 550 compares the output signal 572 of the sampling-integrating unit 550 with a third reference signal and generates a comparator output signal according to the comparison result. The comparator 104 can be controlled by the signal $PH_2$ and operate when the signal $PH_2$ is at a high level, in one embodiment. In one embodiment, a non-inverting terminal of the comparator 104 is connected to ground such that a voltage level of the third reference signal is substantially zero. The comparator 104 can generate a 1-bit digital signal, e.g., logic 1 or logic 0, according to the comparison result. The comparator output signal, e.g., a 1-bit digital signal, is further sent to the multiplexer 108.

The multiplexer 108 can pass the digital signal from the comparator 104 to one of the digital filters $F_1$, $F_2$, $F_3$ and $F_4$ associated with the selected input channel according to the system clock signal $S_{CLK}$. Therefore, multiple digital output signals associated with the multiple input channels can be obtained from the digital filters $F_1$, $F_2$, $F_3$ and $F_4$ respectively.

When one input channel is selected according to the system clock signal $S_{CLK}$ in a new conversion cycle, the multiplexer 108 can transfer the 1-bit digital signal of the same input channel which is generated in a previous conversion cycle to the DAC 106. The DAC 106 converts the 1-bit digital signal to an analog signal, which can be sent to the sampling-integrating units 530 and 550 as the feedback signal 111.

Figure 6:
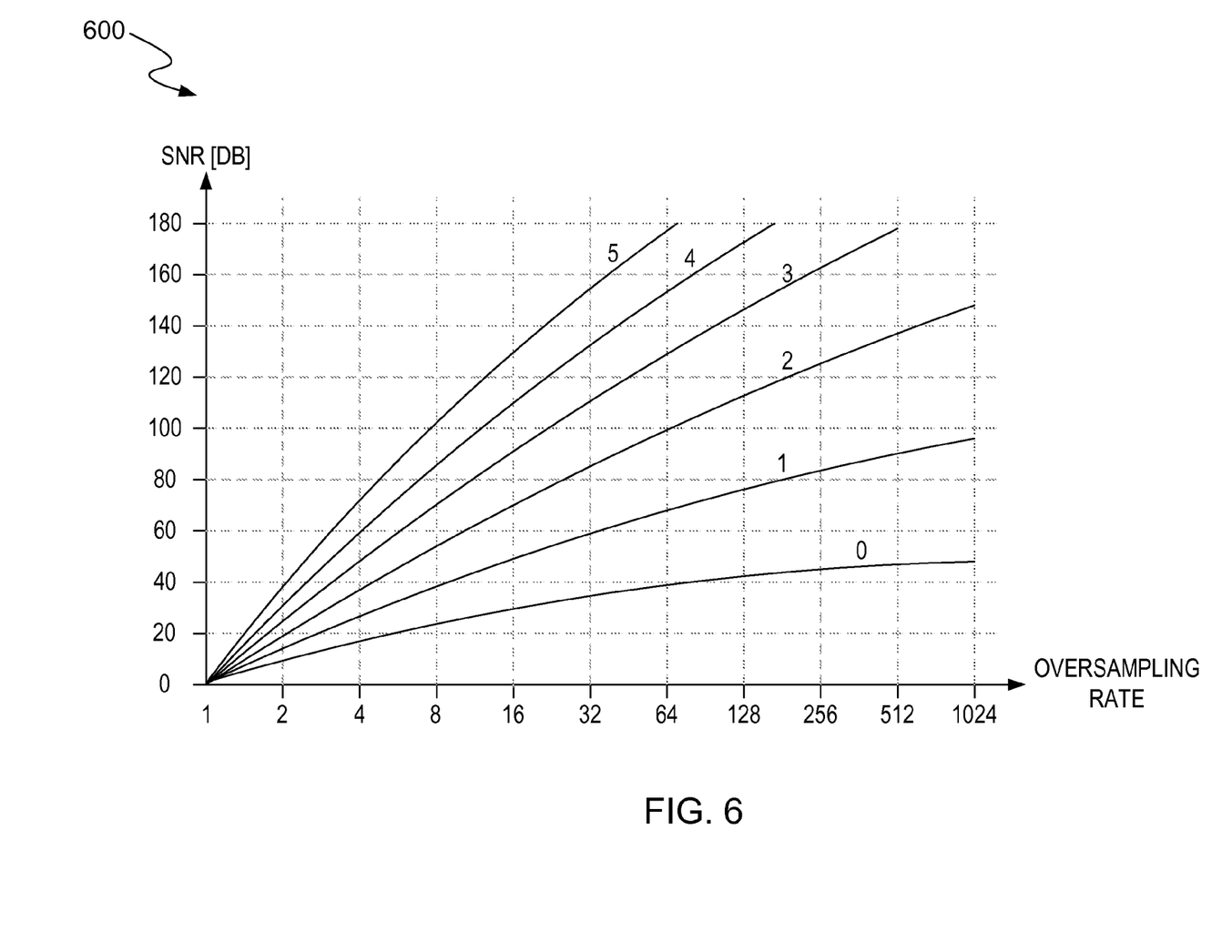
FIG. 6 illustrates curves of a signal to noise ratio (SNR) with respect to an over sampling ratio for different orders of the ADCs, in accordance with one embodiment of the present invention.

For different orders of the ADCs, e.g., the first-order ADC 100 and the second-order ADC 500, a maximum value of a signal-to-noise ratio (SNR) of the ADC varies with respect to the over sampling ratio and the predefined order of the ADC. The maximum value of the SNR of an ADC with a predefined order L is given in the following equation (1):

$$SNR_{MAX} = \frac{P_S}{P_N} = \frac{3}{2}\left(\frac{2L+1}{\pi^{2L}}\right)(2^N - 1)^2 OSR^{(2L+1)}, \quad (1)$$

where OSR represents the over sampling ratio of the ADC and N represents a quantization resolution. FIG. 6 illustrates examples of curves of the SNR with respect to the over sampling ratio OSR for different orders of the ADCs. As shown in FIG. 6, the SNR depends on the over sampling ratio and the order of the ADC. For an ADC with a certain order, e.g., L=0, 1, 2, 3, 4, or 5, the SNR is increased with respect to the OSR. For the same OSR, e.g., OSR=64, the higher the order of the ADC, the more the noise is suppressed during the analog to digital conversion of the input signal. Accordingly, for the ADC having a higher order, a bandwidth of the input signal is increased, the clock rate is decreased, and the output precision is enhanced.

Additionally, in one embodiment, the output signal of the integrating circuit of the sampling-integrating unit 530 is not input into the integrating circuit of the sampling-integrating unit 550 directly but is sampled by the sampling circuit of the sampling-integrating unit 550. When the sampling circuit of the sampling-integrating unit 550 sends the sampled signal to the integrating circuit of the sampling-integrating unit 550 in response to the signal PH1, the sampling circuit of the sampling-integrating unit 550 is decoupled from the integrating circuit of the sampling-integrating unit 550 in response to the signal PH2. As such, the integrating circuits in different sampling-integrating units can work independently, and thus enhance the stability of the system.

Figure 7:
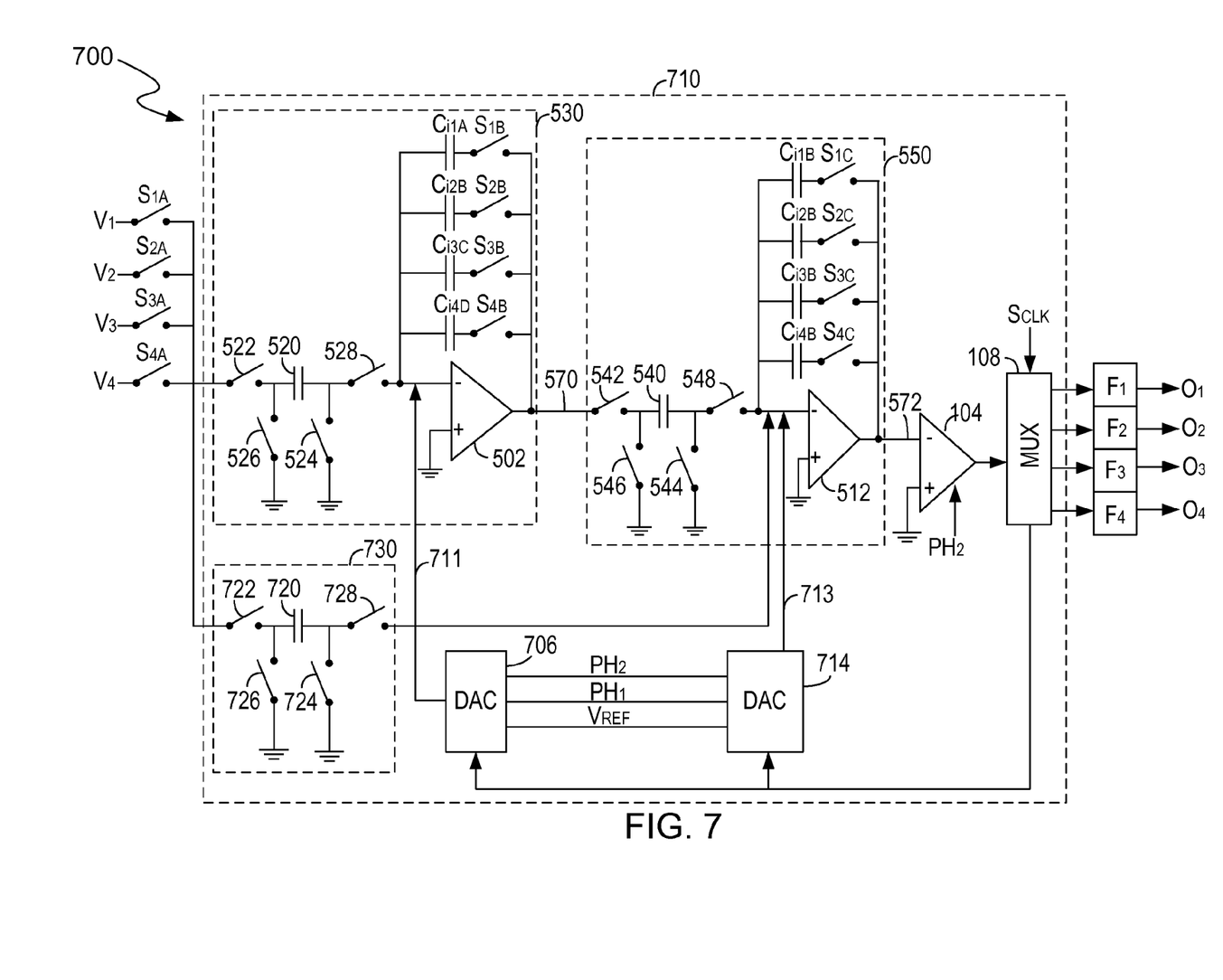
FIG. 7 illustrates a block diagram of a multi-channel ADC, in accordance with another embodiment of the present invention.

FIG. 7 illustrates a block diagram of a multi-channel ADC 700, in accordance with one embodiment of the present invention. The multi-channel ADC 700 can be a multi-order delta-sigma ADC, e.g., a second-order delta-sigma ADC. Elements that are labeled the same as in FIG. 1 and FIG. 5 have similar functions. FIG. 7 is described in combination with FIG. 1 and FIG. 5.

As shown in FIG. 7, a modulator 710 further includes a feedforward circuit 730 for sampling an input analog signal received via a selected input channel and transferring a sampled signal of the input analog signal to the integrating circuit of the sampling-integrating unit 550. The feedforward circuit 730 includes an energy storage unit, e.g., sampling capacitor 720, for storing charges from the selected input channel, and further includes a switch array including switches 722, 724, 726 and 728 for controlling the energy storage unit 720. The switches 722 and 724 are controlled by the signal $PH_2$, and the switches 726 and 728 are controlled by the signal $PH_1$. As such, the switches 722, 724 and switches 726, 728 can be turned on alternately.

During the operation, when an input channel, e.g., the channel 1, is selected, the energy storage unit 720 can store charges of the analog signal input from the channel 1 when the switches 722 and 724 are turned on. The stored charges in the energy storage unit 720 are then transferred to the integrating circuit of the sampling-integrating unit 550 when the switches 726 and 728 are turned on. As such, the integrating circuit of the sampling-integrating unit 550 can integrate a superposition of the sampled signal of the output signal 570, the sampled signal of the input analog signal, and the feedback signal to generate the output signal 572.

Furthermore, the modulator 710 includes a digital to analog converter (DAC) 706 and a DAC 714 for generating feedback signals 711 and 713 according to the 1-bit digital signal of the selected input channel, which is generated in a previous conversion cycle, from the multiplexer 108. The feedback signals 711 and 713 are provided to the integrating circuit of the sampling-integrating unit 530 and the integrating circuit of the sampling-integrating unit 550 respectively.

Advantageously, by providing the sampled signal of the input analog signal to the integrating circuit of the sampling-integrating unit 550 via the feedforword circuit 730, the amplitude of the output signal 572 of the sampling-integrating unit 550 can be controlled within a certain range. As such, the stability of the multi-order ADC 700 is further improved. Additionally, the DACs 706 and 714 can generate and provide the feedback signals 711 and 713 independently, which also helps improve the stability of the multi-order ADC 700.

Figure 8:
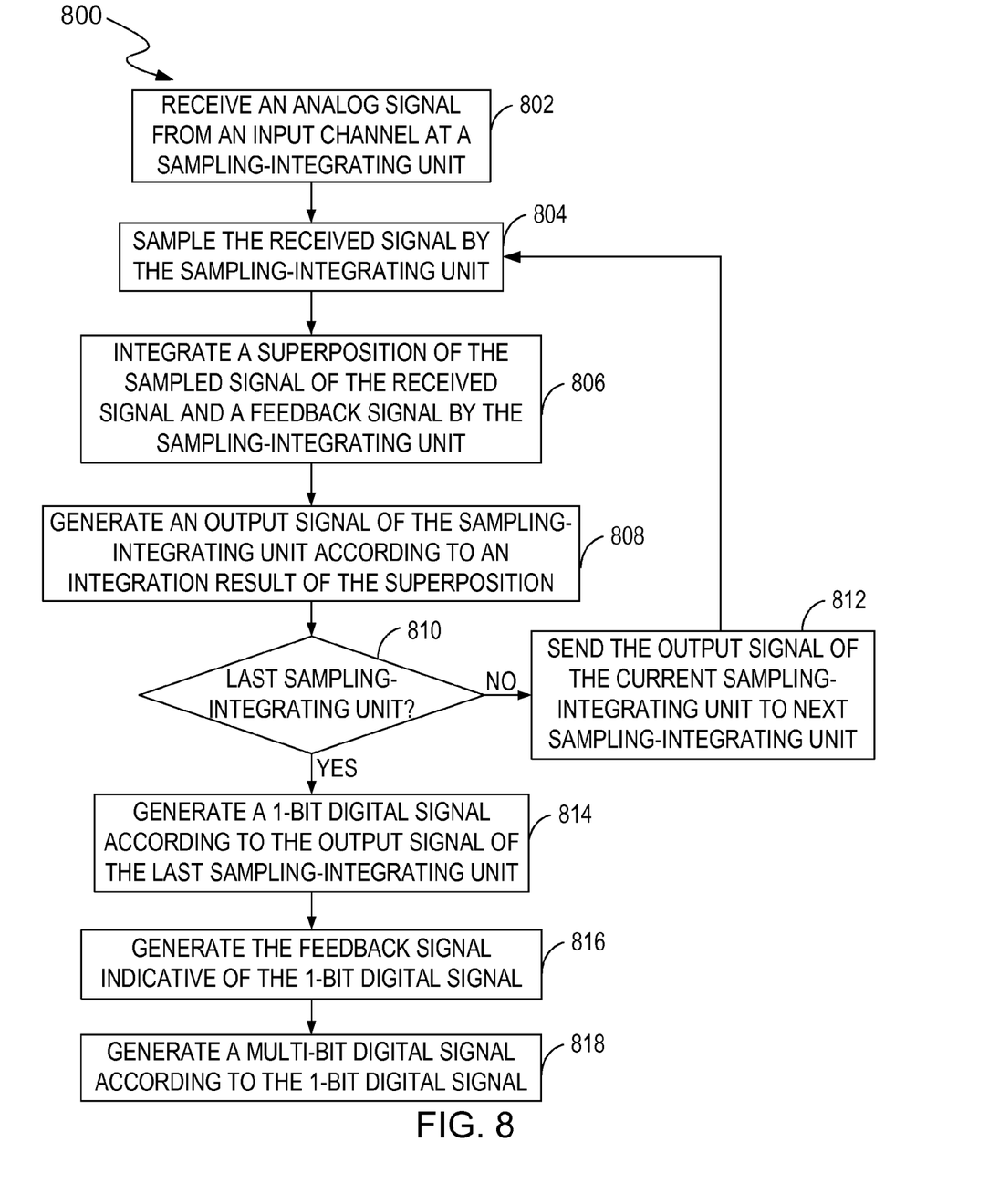
FIG. 8 illustrates a flowchart of operations performed by a multi-channel ADC, in accordance with one embodiment of the present invention.

FIG. 8 illustrates a flowchart 800 of operations performed by a multi-channel ADC, e.g., the multi-channel ADC 500, in accordance with one embodiment of the present invention. FIG. 8 is described in combination with FIG. 5. An input channel, e.g., channel 1, channel 2, channel 3, or channel 4, is selected to receive an analog signal by the multi-channel ADC 500 during a clock cycle of the system clock signal SILK. In block 802, the analog signal can be input into a sampling-integrating unit, e.g. the sampling-integrating unit 530. In block 804, the analog signal is sampled by a sampling circuit in the sampling-integrating unit 530 during the same clock cycle under the control of a switch array. In block 806, an integrating circuit in the sampling-integrating unit 530 can integrate a superposition of the sampled signal of the input analog signal and a feedback signal. In block 808, the integrating circuit generates an output signal according to an integration result of the superposition.

In block 810, if the current sampling-integrating unit is the last sampling-integrating unit in the multi-channel ADC 500, the flowchart 800 goes to block 814. Otherwise, the flowchart 800 goes to block 812. In block 812, the output signal of the current sampling-integrating unit can be input into a next sampling-integrating unit, e.g., the sampling-integrating unit 550. Then, the flowchart 800 goes back to block 804.

In block 814, a comparator, e.g., the comparator 104, can generate a 1-bit digital signal according to the output signal of the last sampling-integrating unit, e.g., the output signal 572 of the sampling-integrating unit 550. More specifically, the comparator 104 compares the output signal 572 of the sampling-integrating unit 550 with a reference signal to generate the 1-bit digital signal, and sends the 1-bit digital signal to a multiplexer, e.g., the multiplexer 108. In block 816, the multiplexer 108 outputs the 1-bit digital signal to the DAC 106 and a corresponding digital filter, e.g., $F_1$, $F_2$, $F_3$ or $F_4$. The feedback signal 111 indicating the 1-bit digital signal is also generated. In block 818, the corresponding digital filter generates a multi-bit digital output signal according to the 1-bit digital signal. More specifically, the corresponding digital filter accumulates the 1-bit digital signals for several conversion cycles for a corresponding input channel and then generates the multi-bit digital output signal.

Accordingly, embodiments according to the present invention provide a multi-channel analog to digital converter (ADC) for converting multiple analog signals received through corresponding input channels to corresponding digital signals. The multi-channel ADC includes multiple sampling-integrating units coupled in series, in one embodiment. By including multiple sampling-integrating units, the ADC has a higher order and thus the signal-to-noise ratio of the ADC is improved and the ADC precision is further enhanced.

The embodiments that have been described herein, however, are some of the several that utilize this invention and are set forth here by way of illustration but not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. An analog to digital converter (ADC) for converting an analog signal to a digital signal, said ADC comprising:
an input channel receiving said analog signal;
a first sampling-integrating unit, that receives said analog signal from said input channel, and that samples said analog signal, and that integrates a first superposition of a first feedback signal and a first sampled signal of said analog signal, and that generates a first output signal;
a second sampling-integrating unit, that receives said first output signal, and that samples said first output signal, and that integrates a second superposition of a second feedback signal and a sampled signal of said first output signal, and that generates a second output signal, wherein each of said first and second sampling-integrating units comprises a first energy storage unit and a first switch array coupled to said first energy storage unit controlling said first energy storage unit; and
a feedback circuit, coupled to said first and second sampling-integrating units, that generates said digital signal according to said second output signal, and that provides said first and second feedback signals indicative of said digital signal to said first and second sampling-integrating units respectively,
wherein said second sampling-integrating unit comprises at a first error amplifier that compares a first reference signal with said second superposition of said second feedback signal and said sampled signal of said first output signal, and that generates a first error signal.

2. The ADC of claim 1, wherein each of said first and second sampling-integrating units comprises an integrating capacitor coupled to a switch in series, which stores charges from said first energy storage unit when said switch is turned on.

3. The ADC of claim 1, wherein said first sampling-integrating unit comprises a second error amplifier that compares a second reference signal with said first superposition of said first feedback signal and said first sampled signal of said analog signal, and that generates a second error signal.

4. The ADC of claim 1, wherein said feedback circuit comprises a comparator, coupled to said second sampling-integrating unit, that compares said second output signal with a third reference signal, and that generates a comparator output signal.

5. The ADC of claim 4, wherein said feedback circuit further comprises a multiplexer, coupled to said comparator, that provides said digital signal according to said comparator output signal.

6. The ADC of claim 1, wherein said feedback circuit comprises a digital to analog converter (DAC), coupled to said first and second sampling-integrating units, that generates said first and second feedback signals.

7. The ADC of claim 1, further comprising:
a feedforward circuit, coupled to said input channel, that samples said analog signal and provides a second sampled signal of said analog signal to said second sampling-integrating unit,
wherein said second sampling-integrating unit generates said second output signal by integrating a third superposition of said sampled signal of said first output signal, said second sampled signal of said analog signal, and said second feedback signal.

8. The ADC of claim 7, wherein said feedforward circuit comprises:
a second energy storage unit and a second switch array coupled to said second energy storage unit controlling said second energy storage unit.

* * * * *